United States Patent [19]

Cotty

[11] Patent Number: 5,621,484
[45] Date of Patent: Apr. 15, 1997

[54] USER-PROGRAMMABLE CONTROL DEVICE FOR A TELEVISION APPARATUS

[75] Inventor: Michel Cotty, Mezieres/Seine, France

[73] Assignee: U.S. Philips Corporation, New York, N.Y.

[21] Appl. No.: 657,476

[22] Filed: May 29, 1996

Related U.S. Application Data

[63] Continuation-in-part of Ser. No. 442,554, May 16, 1995.

[30] Foreign Application Priority Data

May 18, 1994 [FR] France ................... 94 06073

[51] Int. Cl.$^6$ .............. H04N 5/44; H04N 5/445
[52] U.S. Cl. ............... 348/734; 348/569; 348/563
[58] Field of Search ...................... 348/734, 563, 348/569, 553, 564; 340/825.72, 825.69; 359/148; 455/70, 92, 151.1; H04N 5/44, 5/445

[56] References Cited

U.S. PATENT DOCUMENTS

| 3,987,414 | 10/1976 | Tuma .................. 348/734 |
| 4,398,193 | 8/1983 | Kuniyoshi et al. ............. 348/825.76 |
| 4,626,892 | 12/1986 | Nortrup et al. ............. 348/569 |
| 5,229,763 | 7/1993 | Nakamaru ............. 340/825.72 |
| 5,357,276 | 10/1994 | Banker et al. ............. 348/7 |
| 5,410,326 | 4/1995 | Goldstein ............. 348/134 |

FOREIGN PATENT DOCUMENTS 8305109  1/1988  Germany .............. H04N 5/44

Primary Examiner—Glenton B. Burgess
Attorney, Agent, or Firm—Edward W. Goodman

[57] ABSTRACT

In a modern television apparatus, the settings are generally realized by menu-calling sequences in which different menus successively appear on the display screen. Finally, a variable is retained and it is possible to increase or decrease its value by way of a pair of "+" and "−" keys (13), respectively. The last variable which has been set by the sequence of menus can now be set again after such a sequence and without having to run through this sequence again if the "normal" keys (13) are subsequently used. Moreover, additional "+" and "−" keys (15) having about the same function may be provided: the variable to be set by means of the keys 13 and 15, respectively, will be the one which has been set by way of the same keys during a previous sequence of menus.

7 Claims, 3 Drawing Sheets

USER-PROGRAMMABLE CONTROL DEVICE FOR A TELEVISION APPARATUS

CROSS-REFERENCE TO RELATED APPLICATIONS

This is a continuation-in-part of U.S. patent application Ser. No. 08/442,554, filed May 16, 1995, pending.

BACKGROUND OF THE INVENTION

1. Field of the Invention

The invention relates to a control device for an audio or video apparatus, comprising so called normal acquisition means with which a plurality of different types of settings can be chosen by means of specific control sequences each resulting in the setting of a given variable to be set, and comprising a memory location for registering a type code, such a type code being defined for each variable to be set so as to identify which type of variable to be set is concerned, and writing means for writing the type code of a variable to be set into said memory location.

The above-mentioned normal acquisition means, which are at the user's disposal generally consist of a series of keys arranged on a hand-held infrared remote control unit and/or on the front of the apparatus. Alternatively, the means may be sensitive areas for selection without contact, for example, by touching the screen or by voice control, or any known acquisition means in the television apparatus itself or in a remote control unit. Only the embodiment in which keys of a remote control unit are used will be described hereinafter.

2. Description of the Related Art

Formerly, as many pairs of special keys were used as there were different variables to be set, all this leading to a large number of control keys. Moreover, to avoid translation into various languages, the keys were marked by means of symbols and logos which were all the more difficult to recollect since they are present in larger numbers.

To avoid this situation, the system of menus was invented: main menus and sub-menus appearing on the display screen were introduced in the majority of apparatuses at the end of the 1980's. These menus can be shown in plain words in all languages, thanks to the use of simple software. Nevertheless, this method has also a drawback: a certain number of selections is required to reach the desired command, which involves a loss of time for the user. This is the reason why, in addition to a menu-controlled process, special keys for some of the most commonly used commands have been maintained. There are, for example, special keys for controlling the sound because they are used very frequently. However, if there are large numbers of such special controls, one will run up against the initial drawback, and if there is a smaller number of them, they may not be exactly the ones desired by the user.

One solution is to provide a limited number of special keys and furnish the user with the means to assign a given function to a given key, dependent on the user's wishes.

A means for reprogramming a remote control device is known from European Patent Application EP-A-0 446 864, corresponding to U.S. Pat. No. 5,229,763. In accordance with this document, the remote control device learns a new function from a second remote control device which modifies the first by writing a type code of a variable to be set into a memory location.

SUMMARY OF THE INVENTION

It is an object of the invention to avoid loss of time in the menu process and prevent the presence of an excessively large number of keys for a device which is economical and simple to use.

To this end, the device comprises means for automatically activating said writing means whenever a given variable is set at the end of one of said specific control sequences, so as to write the type code of the variable which has thus been set, and at least a so-called easy acquisition means with which the variable, whose code is present in said memory location, can be set, in association with means for carrying out said setting.

The invention is then based on the idea of giving to the "+" and "−" control keys, the function of setting the last variable which has been set by means of the sequence of menus, as long as such a sequence is not started again.

In accordance with a variant, the device comprises so-called assigning means, with which the user can trigger, if desired, at the end of one of said specific control sequences, the writing into said memory location of the type code of the variable which has been set, and at least a so-called easy acquisition means with which the variable, whose code is present in said memory location, can be set in association with means for carrying out said setting.

The user may thus choose the type of variable assigned to the easy acquisition means.

In a particular embodiment, the device is provided with means for triggering the writing into the memory location when said easy acquisition means are used.

Advantageously, the device comprises a plurality of easy acquisition means and as many memory locations for a type code, each of which corresponds to an easy acquisition means.

Thus, different users may each have the disposal of a personal, easy control facility.

The device may also comprise at least two easy acquisition means and as many memory locations for a type code, one for which the writing means are automatically activated whenever a given variable has been set at the end of one of said specific control sequences, and the other for which said assigning means are provided, with which the writing into the memory location of the type code of said given variable to be set can be triggered, if desired, after said given variable has been set at the end of one of said specific control sequences.

For a subsequent setting, a user may thus choose between two types of settings which can be used immediately: the setting which he has previously determined by using the assigning means, and the setting which was the last to be realized by means of the set of menus.

These and other aspects of the invention will be apparent from and elucidated with reference to the embodiments described hereinafter.

BRIEF DESCRIPTION OF THE DRAWINGS

With the above and additional objects and advantages in mind as will hereinafter appear, the invention will be described with reference to the accompanying drawings, in which.

DESCRIPTION OF THE PREFERRED EMBODIMENTS

Figure 1:
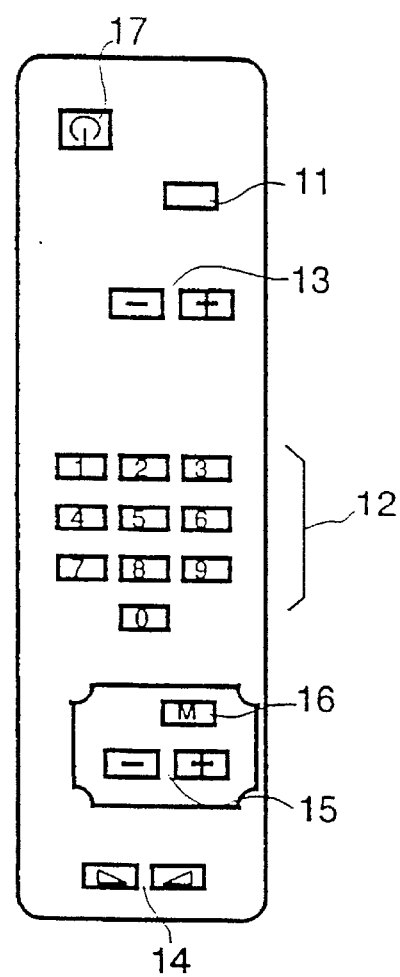
FIG. 1 shows a TV remote control unit provided with the means according to the invention.

The remote control unit shown in FIG. 1 comprises a standby key 17, a key 11 for calling a menu, a pair of keys 14 for volume control, and a keyboard 12 with which a menu can be selected (which may be a number of a row in the menu as mentioned hereinafter) and can also be used to start up the television apparatus by pressing the key(s) corresponding to the desired channel number.

A pair of keys 13 bears the symbols "+" and "−". With these keys, almost all the variables of the television apparatus can be set, for example, luminance, contrast, color saturation, bass and treble, switching from one channel to the other, or returning to the previous channel number, in the order of the numbers, etc.

Figure 2:
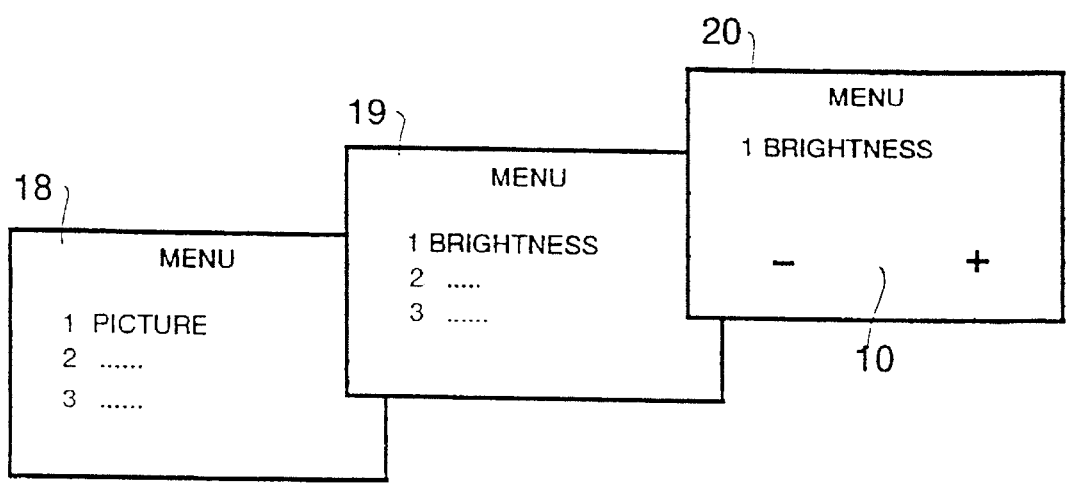
FIG. 2 shows an aspect of a television display screen in three successive states corresponding to a specific sequence of controls.

A general control procedure, referred to as normal acquisition means, may consist of, for example, a specific sequence comprising the steps shown in FIG. 2. Upon a first touch of the key 11 for calling the menu, window 18 will appear on the display of the television apparatus. This window 18 provides a plurality of possible settings, one of which has the number 1 and relates to the picture. Let it be assumed that the user chooses this facility and presses, for example, the key "1" of the keyboard. Window 19 will then appear. This, in turn, provides a plurality of possibilities of settings, one of which has the number 1 and relates to brightness. Let it be assumed that the user chooses this facility and presses key "1" again. Window 20 will then appear. This window relates solely to brightness, as is shown by way of a rectangle lighting up in the word "BRIGHTNESS" and the brightness of the display can be increased or decreased by means of the "+" and "−" keys 13, which are repeated as the symbols + and − at the bottom of the screen. This is done in association with setting means, using, for example, a control value acting on a programmable integrated audio or video circuit. These means are not shown because they are known to those skilled in art. A bar 10, having a length which varies in accordance with the setting and visualizes its effect, also appears at the bottom of the window. It is to be noted that the user has to run through three menus to arrive at the setting of the brightness. The volume control is not provided in a menu because the keys 14 are intended for this purpose. Keys 14 are provided in addition to the menu control process because they are used very frequently.

A type code is defined for each variable to be set, identifying which type of variable to be set is concerned. The type code is used to "address" the setting means (noted above) for adjusting the appropriate variable. There is, for example, a type code for luminance, another type code for contrast, another type code for color saturation, a type code for bass level, and another type code for treble level, etc.

Figure 3:
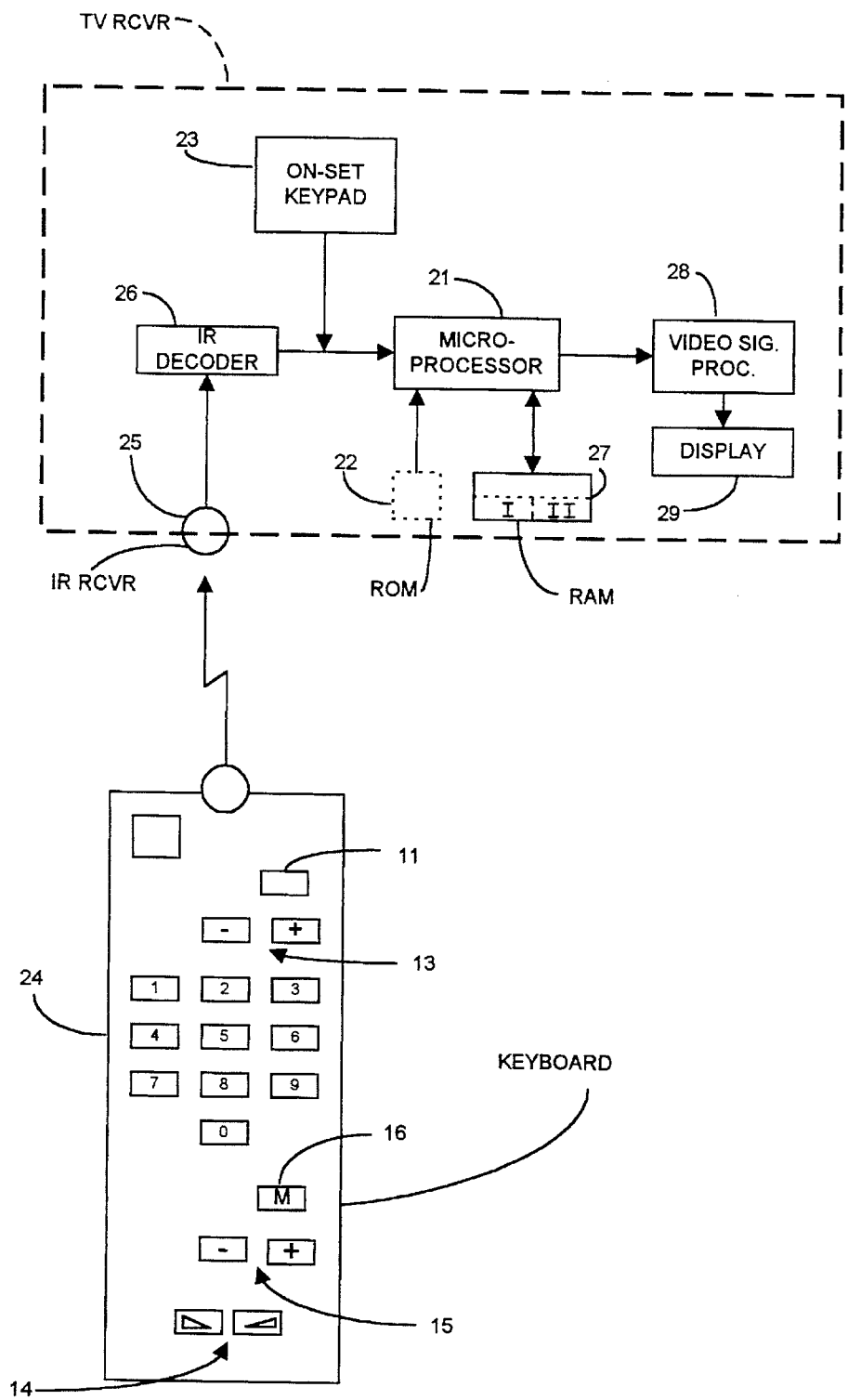
FIG. 3 is a block diagram of a remote control unit as in FIG. 1, and a television receiver incorporating the invention.

The television set is usually provided, as shown in FIG. 3, with a processor, generally a microprocessor 21 with a memory, for example, ROM 22, for storing the operating instruction of the microprocessor 21, and the plurality of type codes along with instructions for accessing the respective setting means (it should be noted that ROM 22 may be internal to the microprocessor 21), the microprocessor 21 managing the operations of the television set, and a keypad 23 for interacting with the microprocessor 21. In addition, the television set may be provided with a remote control transmitter 24 in which case, the television set includes an IR receiver 25 and a decoder 26 for interacting with the microprocessor 21. The television set further includes a video signal processor 28 for processing the signals from the microprocessor 21 and for displaying the same on a display 29 (for example, the menus shown in FIG. 2).

The remote control transmitter 24 and the keypad 23 include the above-mentioned keys 13, 15 and 16. A memory, for example, RAM 27, is connected to the microprocessor 21 for temporarily storing some data. First and second memory locations I and II are provided in the RAM 27 for temporarily storing at least one of said type codes.

Writing means, in practice a software element of said microprocessor 21, are activated whenever a variable has been set by its respective setting means at the end of one of said specific control sequences, for writing, into said first memory location I, the type code of the variable which has been set. For the case described above with reference to FIG. 2, the type code in question is thus the luminance type code (referred to as "BRIGHTNESS" in the menus 19 and 20 for the user's convenience).

In addition to its function associated with the menus, the pair of remote control keys 13 constitutes said "easy acquisition means": when no menu is shown on the display, it accesses the setting means for the variable whose type code is present in the first memory location I.

When the microprocessor 21 detects the activation of one of the keys 13, it reads the type code which is present in the memory location I at that instant and, by means of the appropriate setting means, subjects the corresponding variable to an increase (if the "+" key is activated) or a decrease (if the "−" key is activated). The bar 10 of the menu 20 in FIG. 2 will then appear at the bottom of the window for a limited period of time, assuming that the type code for "BRIGHTNESS" is, at present, stored in the memory location I.

The keys 13 are only used for accessing the setting means for the variable whose type code is currently in the memory location I, until other menus, for example, menus 18 and 19, are called again to realize another setting.

In practice, it is advantageous to have at least two sets of keys: a set 13 and a set 15. Two operating modes are then possible. To this end, the device has a second memory location II for storing one of said type codes and the software writing means enable the type code of the variable that is being set to be written into the second memory location II, if desired, at the end of one of said menu control sequences, by pressing, for example, a key 16 referred to as the assigning key. In a variant, writing in the memory location II can be triggered when said easy acquisition means are used, i.e., one of the keys 15 is directly pressed (instead of key 16) during menu control, which triggers the writing of the type code of variable in the second memory location II. The key 16 is then not necessary.

The set of keys 13 thus provides the possibility of performing the setting operation that was realized at the end of the last sequence of menus, while the set of keys 15 provides the possibility of voluntarily storing a type code for the setting means of a particular variable, and of subsequently performing this setting operation again, even when this setting is not the one which was carried out last.

Figure 4:
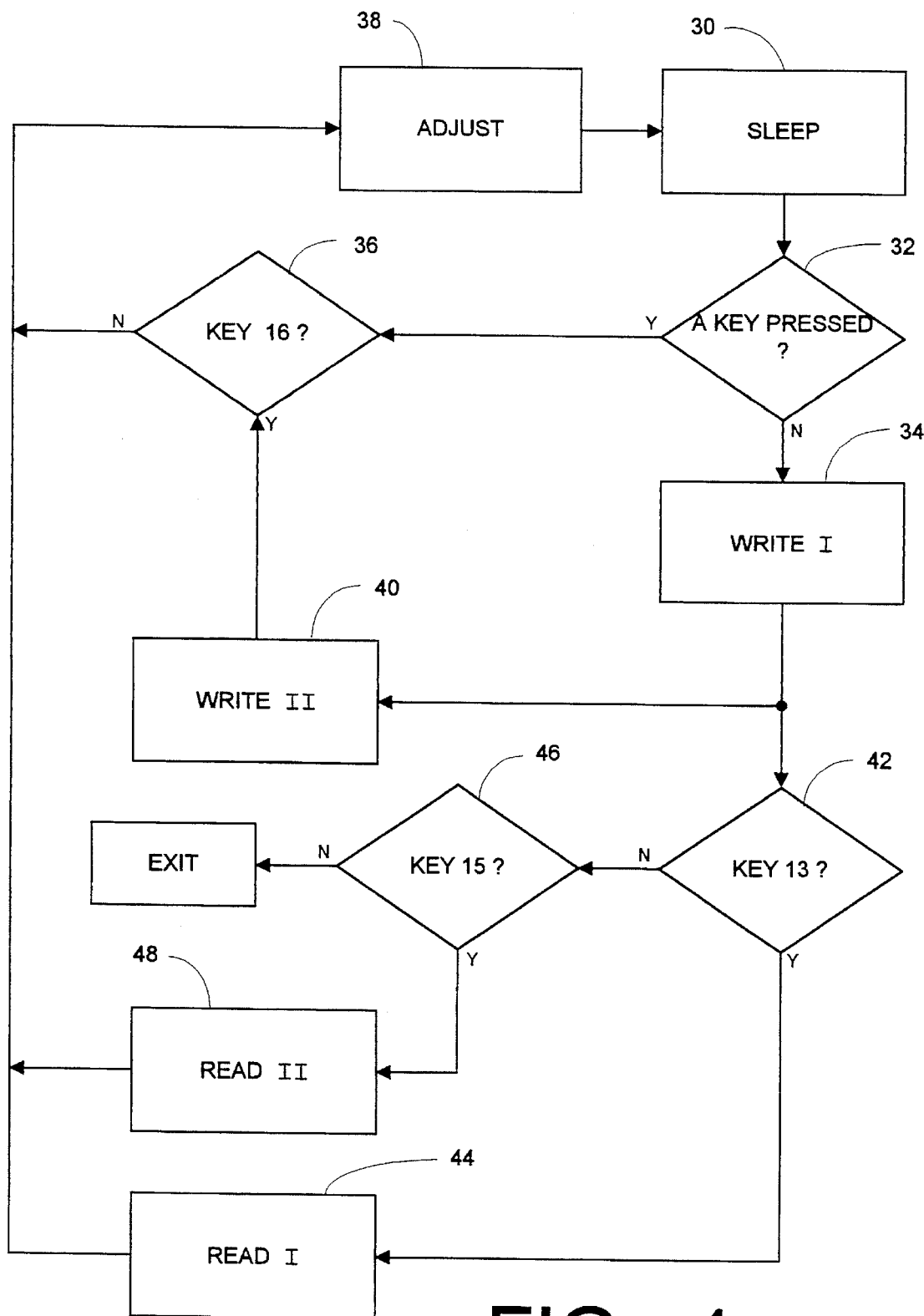
FIG. 4 is a flowchart of the process for controlling the television receiver according to the invention.

A software program is included in ROM 22 for effecting the above process. This program is illustrated in FIG. 4 by means of a flowchart. During the process of the subject invention, the program waits until a key is depressed. This is indicated by the block 30 and the decision block 32 which provides a time limit, after which the program continues with the WRITE I block 34, unless a key is depressed before the time limit. WRITE I means that the type code of the variable that had been previously set and which is found in ROM 22, is written into the first memory location I in RAM 27. In case a key is depressed before the time limit, in block 36, it is determined whether the depressed key is KEY 16. If not, the program proceeds to the ADJUST block 38. The ADJUST block 38 represents any known routine used to adjust a parameter of the television set. The program then returns to the SLEEP block 30. If, alternatively, KEY 16 has been depressed, the program proceeds with the WRITE II block 40. WRITE II means that the type code of the variable that has just been set is written in the second memory location II in RAM 27.

After the WRITE I and WRITE II blocks 34 and 40, in block 42, it is determined whether KEY 13 has been pressed. If so, the program continues to the READ I block 44, in which the type code to be used in ADJUST block 38 is read from the first memory location I in RAM 27 and then the program proceeds to ADJUST block 38. If KEY 13 is not pressed, in block 46, it is determined whether KEY 15 is pressed. If so, the program proceeds to the READ II block 48, in which the type code to be used in ADJUST block 38 is read from the second memory location II in RAM 27, and then the program proceeds to ADJUST block 38. If not, the program is exited.

Moreover, it is easy to provide several identical sets of keys 15 in order that each of these sets is at the exclusive disposal of different users. As a variant, any means (not shown) for identifying potential users and as many sets of first and second memory locations may be provided, while, dependent on the person using the device, a different set of memory locations is selected. A single pair of keys 15 will then be required.

Numerous alterations and modifications of the structure herein disclosed will present themselves to those skilled in the art. However, it is to be understood that the above described embodiment is for purposes of illustration only and not to be construed as a limitation of the invention. All such modifications which do not depart from the spirit of the invention are intended to be included within the scope of the appended claims.

What is claimed is:

1. A control device for an audio or video apparatus, comprising normal acquisition means with which a plurality of different types of settings can be chosen by specific control sequences, each resulting in the setting of a given variable to be set in association with means for carrying out said setting, and comprising a first memory for storing a plurality of type codes, each of said plurality of type codes being defined, respectively, for each variable to be set so as to identify which variable to be set is concerned, a second memory having a memory location for temporarily storing one of said plurality of type codes, and writing means for writing a type code, from said first memory, of a respective variable to be set, into said memory location of said second memory, characterized in that the control device further comprises means for automatically activating said writing means whenever a given variable is set at the end of one of said specific control sequences, whereby the type code of the variable which has thus been set is written in the memory location of said second memory, and easy acquisition means with which the variable whose type code is stored in said memory location of said second memory can be set, in association with said means for carrying out said setting.

2. A control device for an audio or video apparatus, comprising normal acquisition means with which a plurality of different types of settings can be chosen by specific control sequences each resulting in the setting of a given variable to be set in association with means for carrying out said settings, and comprising a first memory for storing a plurality of type codes, each of said type codes being defined, respectively, for each variable to be set so as to identify which variable to be set is concerned, a second memory having a memory location for temporarily storing one of said plurality of type codes, and writing means for writing a type code, from said first memory, of a respective variable to be set, into said memory location of said second memory, characterized in that the control device further comprises assigning means for selectively activating said writing means, at the end of one of said specific control sequences, for writing into said memory location, the type code of the variable which has been set, and easy acquisition means with which the variable whose type code is stored in the memory location can be set, in association with said means for carrying out said setting.

3. A control device as claimed in claim 2, characterized in that the device is provided with means for triggering said writing means for writing the type code of the variable to be set into the memory location when said easy acquisition means is used.

4. A control device as claimed in claim 1, characterized in that the device comprises a plurality of easy acquisition means and a plurality of memory locations in said second memory for storing a respective plurality of type codes, each one of said plurality of memory locations corresponding, respectively, to each one of said plurality of easy acquisition means.

5. A control device as claimed in claim 2, characterized in that the device comprises at least two easy acquisition means and at least two corresponding memory locations in said second memory, for storing, respectively, at least two type codes, the writing means being automatically activated for one of said at least two memory locations whenever a given variable has been set at the end of one of said specific control sequences and said assigning means activating said writing means for writing into another of said at least two memory locations, whereby the writing into the memory location of the type code of said given variable to be set is selectively triggered after said given variable has been set at the end of one of said specific control sequences.

6. A control device as claimed in claim 1, characterized in that said means for easy acquisition comprises a pair of control keys, one "+" and one "−", used for increasing and decreasing the respective value of the variable to be set.

7. A control device as claimed in claim 1, characterized in that the control device includes a remote-control device.

* * * * *